United States Patent [19]
von Gentzkow et al.

[11] Patent Number: 5,756,638
[45] Date of Patent: May 26, 1998

[54] PHOSPHORUS-MODIFIED EPOXY RESINS, PROCESS FOR THE PREPARATION THEREOF AND USE THEREOF

[75] Inventors: Wolfgang von Gentzkow, Kleinsendelbach; Jürgen Huber, Erlangen; Heinrich Kapitza, Fürth; Wolfgang Rogler, Möhrendorf; Hans-Jerg Kleiner, Kronberg; Uwe Schönamsgruber, Nürnberg, all of Germany

[73] Assignee: Hoechst AG, Germany

[21] Appl. No.: 525,531

[22] PCT Filed: Mar. 10, 1994

[86] PCT No.: PCT/EP94/00748

§ 371 Date: Oct. 27, 1995

§ 102(e) Date: Oct. 27, 1995

[87] PCT Pub. No.: WO94/21704

PCT Pub. Date: Sep. 29, 1994

[30] Foreign Application Priority Data

Mar. 15, 1993 [DE] Germany ............... 43 08 185.1
Feb. 16, 1994 [DE] Germany ............... 44 04 906.4

[51] Int. Cl.$^6$ .................................................. C08G 59/40
[52] U.S. Cl. .............................. 528/108; 528/99; 528/398; 525/523; 428/413

[58] Field of Search .................. 528/108, 99, 398; 525/523; 428/413

[56] References Cited

U.S. PATENT DOCUMENTS

| | | | |
|---|---|---|---|
| 3,585,166 | 6/1971 | Kerst | 260/45.8 |
| 4,244,893 | 1/1981 | Dürsch et al. | 260/928 |
| 4,267,125 | 5/1981 | Dursch et al. | 260/545 |
| 4,952,646 | 8/1990 | Weil et al. | 525/507 |
| 5,587,243 | 12/1996 | Von Gentzkow et al. | 428/413 |

FOREIGN PATENT DOCUMENTS

| | | |
|---|---|---|
| 0015483 | 9/1980 | European Pat. Off. |
| 0409308 | 1/1991 | European Pat. Off. |

*Primary Examiner*—Frederick Krass
*Attorney, Agent, or Firm*—Connolly & Hutz

[57] ABSTRACT

The present invention relates to phosphorus-modified epoxy resins having an epoxy number from 0 to 1 mol/100 g, comprising structural units which are derived from (A) polyepoxy compounds having at least two epoxy groups per molecule, and
(B) phosphinic and/or phosphonic anhydrides.

The invention further provides a process for preparing these phosphorus-modified epoxy resins and provides for the use of the resins in producing moldings, coatings or laminates.

18 Claims, No Drawings

PHOSPHORUS-MODIFIED EPOXY RESINS, PROCESS FOR THE PREPARATION THEREOF AND USE THEREOF

The present invention relates to novel phosphorus-containing epoxy resins, a process for the preparation thereof and the use thereof. The novel phosphorus-containing epoxy resins, besides being flame-resistant, are, in particular, very easy to process since they have, inter alia, good storage stability.

Epoxy resins are nowadays used on a large scale for the preparation of moldings and coatings having a high level of thermal, mechanical and electrical properties and also for the production of laminates. The low molecular weight or oligomeric starting components can be reacted to form high-grade thermosetting materials using a great variety of hardeners such as, for example, carboxylic anhydrides, amines, phenols or isocyanates. A further advantage of epoxy resins is their processing behavior. In the initial state they are low molecular weight or oligomeric and have a low viscosity at processing temperatures. They are therefore very suitable for encapsulating complex electrical or electronic components and also for impregnation processes. In the presence of suitable reaction accelerators they have satisfactory pot lives. They are also highly fillable with conventional inert inorganic fillers.

In order that in the event of a fire or accident people may be protected and the continued functioning of electrical or electronic devices may be ensured for a certain time, flame resistance is nowadays frequently required cured of epoxy resin materials in electrical engineering. This means that the cured epoxy resin moldings have to be self-extinguishing and must not spread the fire. The detailed requirements are prescribed in the standards applicable to the respective product. Cured epoxy resins used in electronics or electrical engineering must chiefly satisfy the flammability test requirements of UL 94V.

A summary of the possible methods for making epoxy resins flame-resistant can be found in the literature (e.g. Troitzsch, J., "International Plastics Flammability Handbook", 2nd edition, Carl Hanser Verlag, Munich, 1990; Yehaskel, A., "Fire and Flame Retardant Polymers, Noyes Data Corporation, New Jersey, USA, 1979).

Epoxy resins are nowadays generally made flame-resistant by means of halogen-containing, specifically bromine-containing, aromatic components. The resins in question usually contain a filler or glass fabric and frequently also antimony trioxide as a synergist. The problem with this is that in the event of an accident carbonization or combustion can form corrosive and, under unfavorable conditions, ecologically or toxicologically unsafe decomposition products. Considerable technical effort has to be expended for safe disposal by incineration.

There is therefore a considerable need for epoxy resins which achieve the combustion resistance required in the standards without the addition of halogenated components.

An effective way of achieving flame resistance in resin-type substrates has been found to be the use of organic phosphorus compounds. Attempts have therefore already been made to modify epoxy resins with additives based on phosphoric esters such as, for example, triphenylphosphate (DE 1 287 312). However, these compounds migrate out of the cured materials to the surface, particularly at elevated temperature, where they affect the dielectric properties and lead to electro-corrosion.

Epoxy resins having chemically bound phosphorus could be obtained by reacting commercial epoxy resins with the P-OH groups of various phosphoric acids, the P-OH group being added to the oxirane ring and simultaneously causing partial epoxy polymerization. This gives phosphorus-modified epoxy resins which are still reactive and which are bound into the network on curing.

Examples of the crosslinking of epoxy resins with phosphoric acid, acid phosphoric esters and pyrophosphate diesters as acidic crosslinking agent are described in U.S. Pat. No. 2,541,027. Here, in part, corresponding reaction products are first prepared, these being subsequently crosslinked. These reaction products are not storage-stable. Similar products are in fact used in catalytic amounts as accelerators for epoxy curing (FR Patent 2 008 402).

Attempts have also already been discloses to crosslink epoxy resins with phosphonic acids (ZA Patent 6805283).

U.S. Pat. No. 4 613 661 further discloses reaction products of phosphoric monoesters and epoxy resins which still contain free epoxy groups and can be cured with conventional crosslinking agents. These products are of importance for certain paint and coating systems.

It is therefore an object of the invention to provide phosphorus-modified epoxy resins which, besides flame resistance, have high storage stability, allow variation of the phosphorus content, can be prepared simply and cheaply and which are, in particular, also suitable for use in electronics and electrical engineering where high filler contents are customary.

The present invention, then, provides phosphorus-modified epoxy resins having an epoxy value from 0 to about 1 mol/100 g, comprising structural units derived from
(A) polyepoxy compounds having at least two epoxy groups, preferably terminal epoxy groups, per molecule, and
(B) phosphinic and/or phosphonic anhydrides.

The invention further provides processes for preparing such phosphorus-modified epoxy resins and provides for the use thereof in producing shaped bodies, coatings and laminates (composite materials), and provides these articles themselves.

The phosphorus-modified epoxy resins of the invention generally have, depending on the epoxy resin, a phosphorus content from about 0.5 to 13% by weight, based on the resin. This phosphorus content can be set as needed by the molar ratio of polyepoxy compound to phosphinic anhydride/ phosphonic anhydride. The functionality of the epoxy resin used furthermore allows the meeting of the requirement that, on average, preferably at least one epoxy group should be present per molecule of the phosphorus-modified epoxy resin.

The phosphorus-modified epoxy resins of the invention preferably possess a phosphorus content from about 1 to 8% by weight, in particular from about 2 to 5% by weight, based on the resin. They are preferably self-curable. On average, they preferably contain at least one epoxy group, in particular from 1 to 3 epoxy groups, per molecule; accordingly, the average functionality is preferably at least 1, in particular from 1 to 3. The epoxy value preferably lies at from about 0.02 to 1 mol/100 g, particularly preferably from about 0.02 to 0.6 mol/100 g. Furthermore, the phosphorus-modified epoxy resins of the invention generally have an average molecular weight $\overline{M}_n$ (number average; determined by gel chromatography; polystyrene standard) up to about 10,000, preferably from about 200 to 5000 and in particular from about 400 to 2000.

The average molecular weight $\overline{M}_n$ (number average; likewise determined by gel chromatography; polystyrene standard) of the building blocks (A) is generally up to about 9000 and preferably is between about 150 and 4000, in particular between about 300 and 1800; they are preferably derived from polyepoxy compounds having on average from 2 to 6 epoxy groups per molecule (a functionality from 2 to 6). These polyepoxy compounds are preferably polyglycidyl ethers based on aromatic amines, polyhydric phenols, hydrogenation products of these phenols and/or of novolaks (see below).

The structural units (B) are preferably derived from phosphinic anhydrides of the formulae (I) and/or (II)

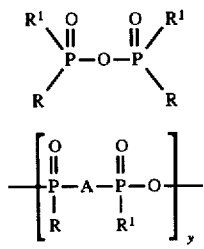

in which

R and $R^1$, independently of one another, are a hydrocarbon radical having from 1 to 20 carbon atoms, preferably from 1 to 10 carbon atoms, which can have aliphatic and/or aromatic character and can be interrupted by heteroatoms or heteroatom groups, preferably a saturated or unsaturated, straight-chain or branched aliphatic radical such as alkyl, alkenyl, cycloalkyl, preferably having from 1 to 8 carbon atoms, in particular from 1 to 6 carbon atoms, such as methyl, ethyl, n- and i-propyl, n-, i- and tert-butyl, the various pentyls and hexyls, or an aryl or an aralkyl radical such as phenyl or naphthyl which is unsubstituted or substituted by preferably from 1 to 3 alkyl radicals having from 1 to 6 carbon atoms or such as phenylalkyl having from 1 to 6 carbon atoms in the alkyl radical, for example benzyl;

A is a divalent hydrocarbon radical having from 1 to 10 carbon atoms, preferably from 1 to 6 carbon atoms and in particular from 1 to 4 carbon atoms, which can have aliphatic and/or aromatic character and can be interrupted by heteroatoms or heteroatom groups, preferably a divalent saturated or unsaturated, straight-chain or branched aliphatic radical and in particular an alkylene radical such as methylene, propylene and the like; y is an integer of at least 1, preferably from 1 to 100 and in particular from 1 to 30, with for y=1 the bridge member A preferably having at least 2 carbon atoms.

The structural units (B) are furthermore preferably derived from phosphonic anhydrides of the formula (III)

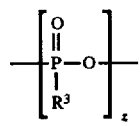

in which $R^3$ is as defined for $R/R^1$ in the formulae (I) and (II) and z is at least 3, preferably from 3 to 100 and in particular from 20 to 60. Besides these structural units there may, if desired, also be present those structural units derived from phosphinic anhydrides of the above formulae (I) and/or (II).

According to a preferred embodiment of the invention, the phosphorus-modified epoxy resin of the invention possesses essentially the structure expressed by the formulae (IV), (V) and/or (VI) below

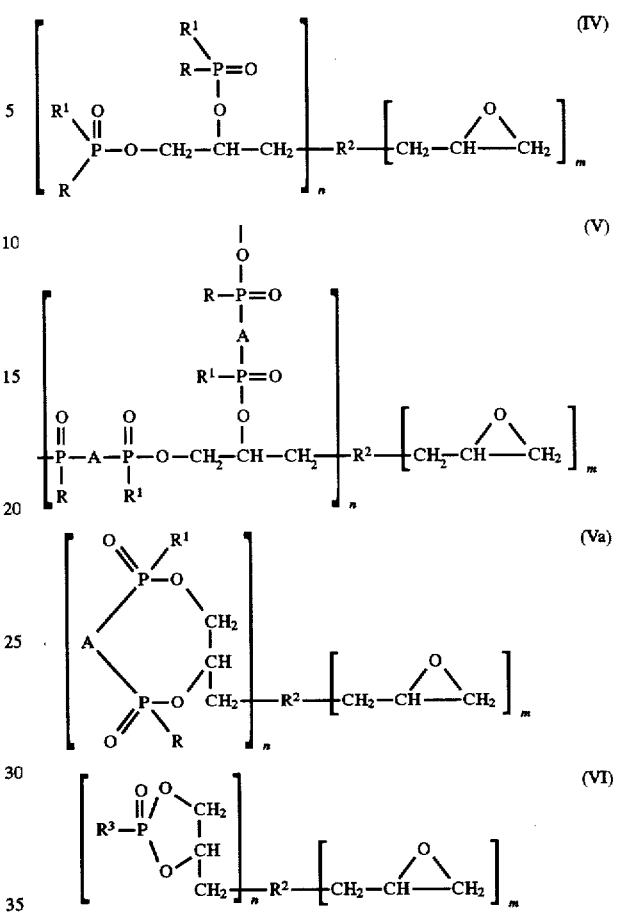

in which

R, $R^1$ and $R^3$ are as specified in the above formulae (I) to (III);

$R^2$ is the radical, without the glycidyl groups, of a polyepoxy compound;

n=integers from 1 to 5, preferably from 1 to 3;

m=integers from 1 to 5, preferably from 1 to 3, where the sum n+m should be an integer from 2 to 6, preferably from 2 to 4.

For example, $R^2$ is the (n+m)-valent radical, without the glycidyl groups, of a polyether, a polyether polyol, a polyester or a polyester polyol;

a hydrocarbon radical which can have saturated or unsaturated aliphatic character and/or aromatic character and which can be interrupted by and/or contain heteroatoms, such as oxygen and nitrogen, and heteroatom groups, such as —$NR^1CO$— ($R^1$ as defined above), with this hydrocarbon radical, which generally contains at least 6, preferably at least from 12 to 30, carbon atoms, preferably containing aryl groups, in particular phenyl groups, which may be substituted but are preferably unsubstituted;

a reaction product of an epoxy compound with polyamines, polyols, polycaprolactone polyols, OH-containing polyesters, polyethers, polyglycols, hydroxy-, carboxyl- and amino-functional polymer oils, polycarboxylic acids, hydroxy- or amino-functional polytetrahydrofurans.

$R^2$ can also be a number of these radicals.

$R^2$ is preferably the corresponding radical of a bisphenol-A-diglycidyl ether, a bisphenol-F-diglycidyl ether or of their oligomers, a polyglycidyl ether of phenol/formaldehyde or cresol/formaldehyde novolak, a diglycidyl ester of tetrahydrophthalic, phthalic, isophthalic or terephthalic acid and also mixtures of these radicals.

Some of these radicals $R^2$ are shown below by way of formulae:

The preparation of the phosphorus-modified epoxy resins of the invention can, for example, be carried out by reaction of the polyepoxy compounds (A) with the phosphinic and/or phosphonic anhydrides (B), preferably in an inert solvent (diluent) or, with modified reaction procedure, also without solvent (diluent).

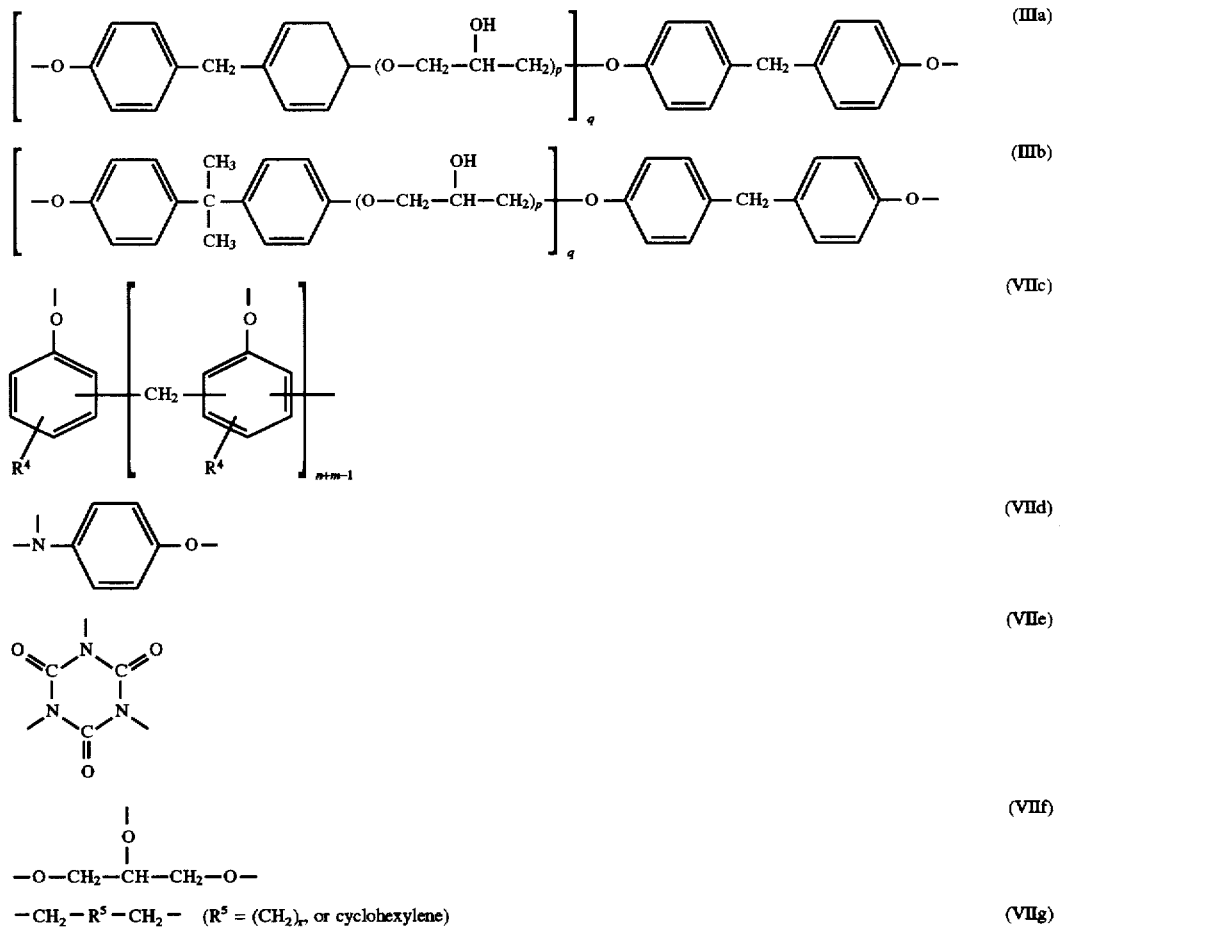

in which $R^4$ is hydrogen and/or the $C_1$- to $C_{10}$-alkyl radical, and the indices n and m are as defined in the formulae (IV) to (VI), and the index p is 0 or 1, the index q is integers from 0 to 40, preferably from 0 to 10, and the index r is integers from 4 to 8.

The phosphorus-modified epoxy resins of the invention may, depending on the method of preparation and purity of the phosphinic anhydrides/phosphonic anhydrides used, also comprise certain amounts, usually not more than 20% by weight, preferably not more then 15% by weight and in particular not more than from 5 to 10% by weight, based on the total mixture, of other structural units.

In the indicated amounts, such by-products do not appreciably affect the property profile of the products of the invention.

As already indicated above, the phosphorus-modified epoxy resins of the invention have, in particular, good storage stability.

The storage stability, expressed as the change in the epoxy number after 96 hours at room temperature and a relative atmospheric humidity of at most 50%, is generally not below 90% and preferably varies in the range from about 95% to 100%, based on the initial value of 100%.

The polyepoxy compounds used according to the invention for this purpose, which are preferably not modified by halogen, can be saturated or unsaturated and also aliphatic, cycloaliphatic, aromatic and/or heterocyclic. They can furthermore, contain those substituents which, under the mixing or reaction conditions, do not cause any interfering secondary reactions, for example alkyl or aryl substituents, ether groups or the like. Mixtures of various polyepoxy compounds can also be used.

These polyepoxy compounds preferably possess the formula (VIII)

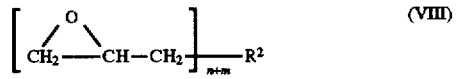

in which $R^2$ and the indices n and m are as defined for formulae (IV) to (VI).

For example, these polyepoxy compounds are polyglycidyl ethers based on polyhydric, preferably dihydric, alcohols, phenols, hydrogenation products of these phenols and/or on novolaks (reaction products of monohydric or polyhydric phenols such as phenol and/or cresols with aldehydes, in particular formaldehyde, in the presence of acid catalysts) which are obtained in a known manner, for example by reaction of the respective polyols with epichlorohydrin.

Examples of polyhydric phenols which may be mentioned here are: resorcinol, hydroquinone, 2,2-bis(4-hydroxyphenyl)propane (bisphenol A), isomer mixtures of dihydroxydiphenylmethane (bisphenol F), 4,4'-dihydroxydiphenylcyclohexane, 4,4'-dihydroxy-3,3'-dimethyldiphenylpropane, 4,4'-dihydroxydiphenyl, 4,4'-dihydroxybenzophenone, bis(4-hydroxyphenyl)-1,1-ethane, bis(4-hydroxyphenyl)-1,1'-isobutane, bis(4-hydroxy-tert-butyl-phenyl)-2,2-propane, bis(2-hydroxynaphthyl)methane, 1,5-dihydroxynaphthalene, tris(4-hydroxyphenyl)methane,1,1'-oxybis(4-hydroxyphenyl). Bisphenol A and bisphenol F are preferred here.

The polyglycidyl ethers of polyhydric aliphatic alcohols are also suitable as polyepoxy compounds. Examples which may be mentioned of such polyhydric alcohols are 1,4-butanediol, 1,6-hexanediol, polyalkylene glycols, glycerol, trimethylolpropane, bis(4-hydroxycyclohexyl)-2,2-propane and pentaerythritol.

Further suitable polyepoxy compounds are (poly)glycidyl esters which are obtained by reaction of epichlorohydrin or similar epoxy compounds with an aliphatic, cycloaliphatic or aromatic polycarboxylic acid such as oxalic acid, adipic acid, glutaric acid, phthalic, isophthalic, terephthalic, tetrahydrophthalic or hexahydrophthalic acid, 2,6-naphthalenedicarboxylic acid and dimerized fatty acids. Examples of these are diglycidyl terephthalate and diglycidyl hexahydrophthalate.

Polyepoxy compounds in which the epoxy groups are randomly distributed over the molecular chain and which can be prepared by emulsion copolymerization using olifinically unsaturated compounds containing these epoxy groups, such as, for example, glycidyl esters of acrylic or methacrylic acid, can also be advantageously used in some cases.

Further polyepoxy compounds which can be used are, for example, those based on heterocyclic ring systems such as, for example, hydantoin epoxy resins, triglycidylisocyanurate and/or oligomers thereof, triglycidyl-p-aminophenol, triglycidyl-p-aminodiphenyl ether, tetraglycidyldiaminodiphenylmethane, tetraglycidyldiaminodiphenyl ether, tetrakis(4-glycidoxyphenyl)ethane, urazole epoxides, uracil epoxides, oxazolidinone-modified epoxy resins. Further, polyepoxides based on aromatic amines such as aniline, for example N,N-diglycidylaniline, diaminodiphenylmethane and N,N'-dimethylaminodiphenylmethane or -sulfone. Further suitable polyepoxy compounds are described in "Handbook of Epoxy Resins" by Henry Lee and Kris Neville, McGraw-Hill Book Company, 1967, in the monograph by Henry Lee "Epoxy Resins", American Chemical Society, 1970, in Wagner/Sarx, "Lackkunstharze", Carl Hanser Verlag (1971), pp. 174 ff. in "Angew., Makromol. Chemie", Volume 44 (1975), pp. 151 to 163, in DE-A 2 757 733 and in EP-A 0 384 939, which are hereby incorporated by reference.

Polyepoxy compounds which are preferably used are bisglycidyl ethers based on bisphenol A, bisphenol F and bisphenol S (reaction products of these bisphenols and epichloro(halo)hydrin) or oligomers thereof, polyglycidyl ethers of phenol/formaldehyde and/or cresol/formaldehyde novolaks and also diglycidyl esters of phthalic, isophthalic, terephthalic, tetrahydrophthalic and/or hexahydrophthalic acid.

The phosphinic anhydrides used for the reaction with the polyepoxy compound preferably possess the formulae (I) and/or (II). Examples which may be mentioned here are: dimethylphosphinic anhydride, ethylmethylphosphinic anhydride, diethylphosphinic anhydride, dipropylphosphinic anhydride, ethylphenylphosphinic anhydride and diphenylphosphinic anhydride. Examples of suitable bisphosphinic anhydrides are: ethane-1,2-bismethylphosphinic anhydride, ethane-1,2-bisphenylphosphinic anhydride, propane-1,3-bismethylphosphinic anhydride, butane-1,4-bismethylphosphinic anhydride, hexane-1,6-bismethylphosphinic anhydride and decane-1,10-bismethylphosphinic anhydride.

Examples of phosphonic anhydrides which have the formula (III) are: methylphosphonic anhydride, ethylphosphonic anhydride, n- and/or i-propylphosphonic anhydride, hexylphosphonic anhydride, octylphosphonic anhydride, decylphosphonic anhydride and phenylphosphonic anhydride.

The preparation of the phosphonic anhydrides of the formula (I) is described, for example, in DE-A 2 129 583, while the preparation of the alkanebisalkylphosphinic anhydrides (II) and the phosphonic anhydrides (III) is derived, for example, from EP-A 0 004 323. With regard to the latter, reference is also made to Houben-Weyl, Meth. d. Organ. Chem. (1963), Volume XII/1, page 612 and to DE-A 2 758 580 and 4 126 235. In the case of the formulae (II) and (III), the corresponding anhydrides possess a ring structure and/or a chain structure.

The anhydrides used according to the invention can, depending on their method of preparation, contain certain amounts of free acids, but in general not more than 20% by weight, preferably not more than 15% by weight and in particular not more than 10% by weight.

Variation of the equivalent ratio of polyepoxy compound to phosphinic anhydride/phosphonic anhydride allows the phosphorus content of the phosphorus-modified epoxy resin of the invention to be adjusted. Normally, the equivalent ratio of polyepoxy compound and phosphinic and/or phosphonic anhydride is from 1:0.1 to 1:1, preferably from 1:0.1 to 0.8 and in particular from 1:0.1 to 1:0.4.

If solvents (diluents) are used in the process of the invention, these are aprotic and preferably possess polar character. Examples of these are: N-methylpyrrolidone; dimethylformamide; ethers such as diethyl ether, tetrahydrofuran, dioxane, ethylene glycol mono- or diethers, propylene glycol mono- or diethers, butylene glycol mono- or diethers of monoalcohols having an alkyl radical of from 1 to 6 carbon atoms which may or may not be branched; ketones such as, for example, acetone, methyl ethyl ketone, methyl isopropyl ketone, methyl isobutyl ketone, cyclohexanone and the like; esters such as ethyl acetate, butyl acetate, ethylglycol acetate, methoxypropyl acetate; halogenated hydrocarbons; (cyclo)aliphatic and/or aromatic hydrocarbons such as hexane, heptane, cyclohexane, toluene, the various xylenes and also aromatic solvents in the boiling range from about 150° to 180° C. (higher-boiling mineral oil fractions such as ®Solvesso). The solvents can here be used individually or as mixtures.

The reaction of the polyepoxy compound with the phosphinic and/or phosphonic anhydride generally occurs at temperatures from −20° to 130° C., preferably from 20° to 90° C.

According to another variant of the process of the invention, the phosphorus-modified epoxy resins, in which the structural units (B) are here derived only from phosphonic anhydrides, can be prepared by eliminating alcohol from phosphorus-modified epoxides (IX) containing structural units which are derived from (A) polyepoxy compounds having at least two epoxy groups per molecule, and (C) phosphonic monoesters, at temperatures of at least 80° C.

The alcohol elimination is preferably carried out at temperatures from 80° to 250° C., in particular from 100° to 150° C., and at reduced pressure, preferably from 100 to 0.1 torr, in particular from 5 to 0.5 torr.

The alcohol elimination can be carried out batchwise or continuously, the latter for example with the aid of a thin-film evaporator.

The alcohol elimination can be accelerated by addition of transesterification catalysts. Titanic and stannic esters, metal salts of carboxylic acids, metal cyanides, alkoxides, organic acids and mineral acids and also metal oxides are usually employed. Examples of suitable compounds are tetrabutyl titanate, tetraisopropyl stannate, sodium, potassium, zinc, magnesium, calcium, cobalt and cadmium salts of acetic acid and other carboxylic acids, sodium and potassium cyanide, sodium and potassium alkoxides of aliphatic alcohols, toluenesulfonic acid and sulfuric acid and also antimony and germanium oxides. The catalysts are used in a concentration from 0.01 to 2% by weight, preferably from 0.05 to 1% by weight, in each case based on the phosphorus-modified epoxy resin.

The phosphorus-modified epoxy resins (IX) used as starting materials for this variant of the process of the invention in general possess a phosphorus content from 0.5 to 13% by weight, preferably from 1 to 8% by weight and in particular from 2 to 5 by weight, based on the resin. Their epoxy content mostly lies between 0 and 1 mol/100 g, preferably from 0.02 to 1 mol/100 g, in particular from 0.02 to 0.6 mol/100 g and their average molecular weight $\overline{M}_n$ (number average, determined by gel chromatography; polystyrene standard) is up to about 10,000, preferably from about 900 to 5000 and in particular from about 400 to 2000. This phosphorus-modified epoxy resin (IX) preferably contains at least one epoxy group, in particular from 1 to 3 epoxy groups, per molecule.

The average molecular weight $\overline{M}_n$ (number average; likewise determined by gel chromatography; polystyrene standard) of the structural units (A) is generally up to about 9000 and preferably lies between about 150 and 4000, in particular between about 300 and 1800; they are preferably derived from polyepoxy compounds having on average from 2 to 6 epoxy groups per molecule (a functionality from 2 to 6). These polyepoxy compounds are preferably polyglycidyl ethers based on aromatic amines, polyhydric phenols, hydrogenation products of these phenols and/or on novolaks (see below).

The structural units (C) of the starting compounds for this process variant are derived from phosphonic monoesters of the formula (X)

in which

R6 is a hydrocarbon radical of from 1 to 20 carbon atoms, preferably from 1 to 6 carbon atoms, and R⁷ is a hydrocarbon radical of from 1 to 10 carbon atoms, preferably from 1 to 4 carbon atoms.

The hydrocarbon radical in $R^6/R^7$ can have aliphatic and/or aromatic character and can be interrupted by heteroatoms or heteroatom groups. It is preferably a saturated or unsaturated, straight-chain or branched aliphatic radical such as alkyl, alkenyl, cycloalkenyl, preferably having from 1 to 8 carbon atoms, in particular from 1 to 6 carbon atoms, such as methyl, ethyl, n- and i-propyl, n-, i- and tert-butyl, the various pentyls and hexyls, or an aryl or an aralkyl radical such as unsubstituted phenyl or phenyl substituted by preferably from 1 to 3 alkyl radicals having from 1 to 6 carbon atoms or such as phenylalkyl having from 1 to 6 carbon atoms in the alkyl radical, for example benzyl.

The preparation of the starting compounds (IX) used for this process variant is carried out by reaction of polyepoxy compounds corresponding to (A) with phosphonic monoesters (X) corresponding to (C) at temperatures from -20° C. to 150° C., preferably from 10° C. to 100° C. and at an equivalent ratio of polyepoxy compound to phosphonic monoester from 1:0.1 to 1:1, preferably from 1:0.1 to 1:0.8. This reaction is preferably carried out in the presence of a solvent which does not impede the reaction. Suitable solvents are those mentioned above for the other process variant.

The polyepoxy compounds used for the preparation of the starting compounds (IX) are also the same ones described further above.

Examples of phosphonic monoesters (X) are: monomethylmethylphosphonate, monoethylethylphosphonate, monoethylpropylphosphonate and monomethylphenylphosphonate. The preparation of these phosphonic monoesters is known from, for example, J. Organometallic Chem., Volume 12 (1960), page 459.

The phosphorus-modified epoxy resins of the invention can be advantageously used as resins in many application areas for producing moldings, prepregs, coatings or laminates (composite materials), in particular for insulation purposes in electrical engineering. They are suitable, for example, for covering, coating and sheathing electronic components, for insulating electrical windings, for producing insulation components and composite materials incorporating fibrous components, in particular laminates for printed circuit boards.

Embodiments of the invention will now be more particularly described by way of examples.

EXAMPLE 1

Preparation of phosphorus-modified epoxy resins by addition of phosphinic anhydrides to epoxidized novolaks.

350 parts by mass (pbm) of an epoxidized novolak having an epoxy number of 0.56 mol/100 g are dissolved in 86 parts by mass of ethyl methyl ketone and admixed with various parts by mass of ethylmethyl- or dimethyl-phosphinic anhydride (see Table 1 below). The solutions obtained are first stirred for 60 minutes at room temperature and then for 90 minutes at an oil bath temperature of 100° C. under reflux. The epoxy numbers of the reaction products are determined immediately after preparation and after a storage time of 96 hours and are shown in Table 1. The epoxy number after 96 hours shows that the reaction products are sufficiently stable in storage.

TABLE 1

$$\begin{array}{c} R \diagdown \overset{O}{\underset{\|}{P}} - O - \overset{O}{\underset{\|}{P}} \diagup R \\ R^1 \diagup \qquad \qquad \diagdown R^1 \end{array}$$

| | | | | Products | | |
|---|---|---|---|---|---|---|
| Mixture no. | R | $R^1$ | pbm | Epoxy number[1] after 0 h (mol/100 g) | Epoxy number[1] after 96 h (mol/100 g) | Phosphorus content[1] (%) |
| 1 | $C_2H_5$ | $CH_3$ | 90 | 0.30 | 0.29 | 6.4 |
| 2 | $CH_3$ | $CH_3$ | 80 | 0.32 | 0.30 | 6.8 |

[1]: based on solid components

EXAMPLE 2

Preparation of phosphorus-modified epoxy resins by addition of n-propylphosphonic anhydride to various epoxy resins Various epoxy resins (see Table 2 below) are dissolved in 140 parts by mass of ethyl methyl ketone and admixed with the parts by mass given in Table 2 of a 50% strength solution of propylphosphonic anhydride in ethyl acetate. The solution obtained is first stirred for 60 minutes at room temperature and then for 90 minutes at an oil bath temperature of 100° C. under reflux. The epoxy numbers of the reaction products are determined after preparation and after a storage time of 96 hours and are summarized in Table 2.

TABLE 2

| | | | | | | Products | | |
|---|---|---|---|---|---|---|---|---|
| Mixture No. | Epoxy resin (pbm)[1] | | | | Propylphosphonic anhydride solution (pbm) | Epoxy number[2] after 0 h (mol/100 g) | Epoxy number[2] after 96 h (mol/100 g) | Phosphorus content[2] (%) |
| | A | B | C | D | | | | |
| 3 | 400 | — | — | — | 100 | 0.34 | 0.34 | 3.2 |
| 4 | — | 400 | — | — | 100 | 0.32 | 0.31 | 3.2 |
| 5 | — | — | 300 | — | 60 | 0.30 | 0.27 | 2.7 |
| 6 | — | — | — | 300 | 60 | 0.37 | 0.35 | 2.7 |

A: Bisphenol-F-diglycidyl ether, epoxy number 0.61 (mol/100 g)
B: Epoxidized novolak, epoxy number 0.56 (mol/100 g), functionality 3.6
C: Epoxidized novolak, epoxy number 0.51 (mol/100 g), functionality 5.5
D: Epoxidized novolak, epoxy number 0.55 (mol/100 g), functionality 4.1
[1]: pbm of pure resin
[2]: based on solid components

EXAMPLE 3

Preparation of phosphorus-modified epoxy resins by addition of various phosphonic anhydrides to epoxidized novolaks A 50% strength solution of various phosphonic anhydrides in ethyl acetate (see Table 3 below) is added to a 75% strength solution of different parts by mass of an epoxy resin (likewise see Table 3 below) in ethyl methyl ketone. The solution obtained is first stirred for 60 minutes at room temperature and then for 90 minutes at an oil bath temperature of 100° C. under reflux. The epoxy numbers of the reaction products were determined after preparation and after a storage time of 96 hours and are shown in Table 3.

TABLE 3

$$\left[ \begin{array}{c} O \\ \| \\ P - O \\ | \\ R^3 \end{array} \right]_z \text{Epoxy resin}^{1)}$$

| | | | | Products | | |
|---|---|---|---|---|---|---|
| Mixture No. | $R^3$ | Solution (pbm) | Solution (pbm) | Epoxy number[2] after 0 h (mol/100 g) | Epoxy number[2] after 96 h (mol/100 g) | Phosphorus content[2] (%) |
| 7 | $C_3H_7$ | 175 | 530 | 0.27 | 0.26 | 5.3 |
| 8 | $C_4H_9$ | 290 | 530 | 0.27 | 0.26 | 5.2 |
| 9 | $C_6H_5$ | 250 | 530 | 0.22 | 0.22 | 5.2 |

[1]: Epoxidized novolak, epoxy number of the pure resin 0.56 mol/100 g, functionality 3.6
[2]: based on solid components

EXAMPLE 4 a) Preparation of the phosphorus-modified epoxy resin (IX)

200 pbm (=parts by mass) of an epoxidized novolak (epoxy number: 0.56 mol/100 g, average functionality: 3.6) and 50 pbm of methyl ethyl ketone were heated to 40° C. 27.5 pbm of monomethylmethylphosphonate were then added dropwise over 30 minutes while stirring. After 1 hour, the mixture was refluxed for a further 1.5 hours, and was then cooled and the solvent was removed in vacuo at a bath temperature of 60° C. This gave 227.5 pbm of compound (IX).

b) Preparation of the phosphorus-modified epoxy resin of the invention 227.5 pbm of compound (IX) according to a) were heated at 0.5 torr to an internal temperature of 150° C. Methanol was eliminated, this being collected in a cold trap downstream of the apparatus. After the elimination was complete, the reaction mixture was cooled to 80° C. This resulted in 220 pbm of a phosphorus-modified epoxy resin. Addition of 36 pbm of methyl ethyl ketone and 18.5 pbm of ethyl acetate at 80° C. gave an 80% strength solution: epoxy number (after 0 h and 96 hours): 0.29 mol/100 g; phosphorus content: 2.83%.

EXAMPLE 5 a) Preparation of the phosphorus-modified epoxy resin (IX)

200 pbm of an epoxidized novolak (epoxy number: 0.56 mol/100 g, average functionality: 3.6) and 50 pbm of methyl ethyl ketone were heated to 40° C. A mixture of 36 pbm of monomethylpropylphosphonate and 29 pbm of ethyl acetate was then added dropwise over 40 minutes while stirring; the mixture was then stirred for a further hour and subsequently refluxed for 1.5 hours. The mixture was subsequently cooled and the solvent was distilled off in vacuo at a bath temperature of 60° C. This gave 236 pbm of compound (IX).

b) Preparation of the phosphorus-modified epoxy resin 236 pbm of compound (IX) according to a) were heated at 0.8 torr up to an internal temperature of 150° C. The eliminated methanol collected in a cold trap downstream of the apparatus. After elimination was complete, the reaction mixture was cooled. This gave 227 pbm of the phosphorus-modified epoxy resin. Addition of 37 pbm of methyl ethyl ketone and 16 pbm of ethyl acetate resulted in an 80% strength solution: epoxy number (after 0 h and 96 h): 0.28 mol/100 g; phosphorus content: 2.9%.

What is claimed is:

1. A self-curable but storage-stable composition consisting essentially of a phosphorous-containing epoxy resin having an epoxy number from 0.02 to 1 mol/100 g, which is the reaction product of the components consisting essentially of:

(A) an epoxy component comprising a polyepoxy compound having at least two epoxy groups per molecule, and (B) a phosphinic anhydride and/or a phosphonic anhydride, the storage stability of said storage-stable, phosphorus-containing epoxy resin composition being sufficient to maintain at least 90% of the initial epoxy number value after 96 hours of storage at room temperature and a relative atmospheric humidity of up to 50%.

2. A self-curable but storage-stable composition consisting essentially of a phosphorous-containing epoxy resin having an epoxy number from 0.02 to 1 mol/100 g, which is the reaction product of the components consisting essentially of:

(A) an epoxy component comprising a polyepoxy compound having at least two epoxy groups per molecule, and (B) a phosphinic anhydride, phosphonic anhydride or a combination of phosphinic and phosphonic anhydrides; said phosphorous-containing epoxy resin having, on average, at least 1 epoxy group per molecule.

3. A phosphorus-containing epoxy resin composition as claimed in claim 2, wherein the phosphorus content is from 0.5 to 13% by weight, based on the resin.

4. A phosphorus-containing epoxy resin composition as claimed in claim 2, whose epoxy number lies between 0.02 and 0.6 mol/100 g.

5. A phosphorus-containing epoxy resin composition as claimed in claim 2, wherein the average molecular weight $M_n$ of the resin ranges from 200 to 5000.

6. A phosphorus-containing epoxy resin composition as claimed in claim 2, wherein the average molecular weight $M_n$ of (A) ranges from 150 to 4000.

7. A phosphorus-containing epoxy resin composition as claimed in claim 2, wherein component (A) comprises a polyepoxy compound having from 2 to 6 epoxy groups per molecule.

8. A phosphorus-containing epoxy resin composition as claimed in claim 2, wherein component (A) comprises a polyglycidyl ether.

9. A phosphorus-containing epoxy resin composition as claimed in claim 8, wherein said polyglycidyl ether is an epoxidized polyhydric phenol, an epoxidized hydrogenation product of a polyhydric phenol, an epoxidized novolak or a mixture thereof.

10. A phosphorus-containing epoxy resin composition as claimed in claim 2, wherein at least one component (B) is a phosphinic anhydride of the formulae (I) or (II) or a combination of (I) and (II)

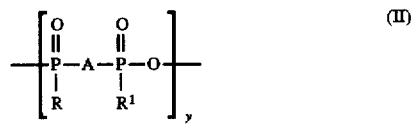

in which

R and $R^1$, independently of one another, are a hydrocarbon radical having from 1 to 20 carbon atoms, A is a divalent hydrocarbon radical having from 1 to 10 carbon atoms, and y is at least 1, and wherein said at least one component (B) may optionally contain a phosphonic anhydride as an additional component.

11. A phosphorus-containing epoxy resin composition as claimed in claim 10, wherein said phosphonic anhydride is present in said component (B), said phosphonic anhydride consisting essentially of repeating units of the formula (III)

in which $R^3$ is as defined for R and $R^1$ in said formula (I) and (II) and z is at least 3.

12. A phosphorus-containing epoxy resin composition as claimed in claim 11, which consists essentially of linear, branched or cyclic units of the formulae (IV), (V), (Va) or (VI) or combinations of said linear, branched or cyclic units, wherein said units of the formulae (IV), (V), (Va) and (VI)

are:

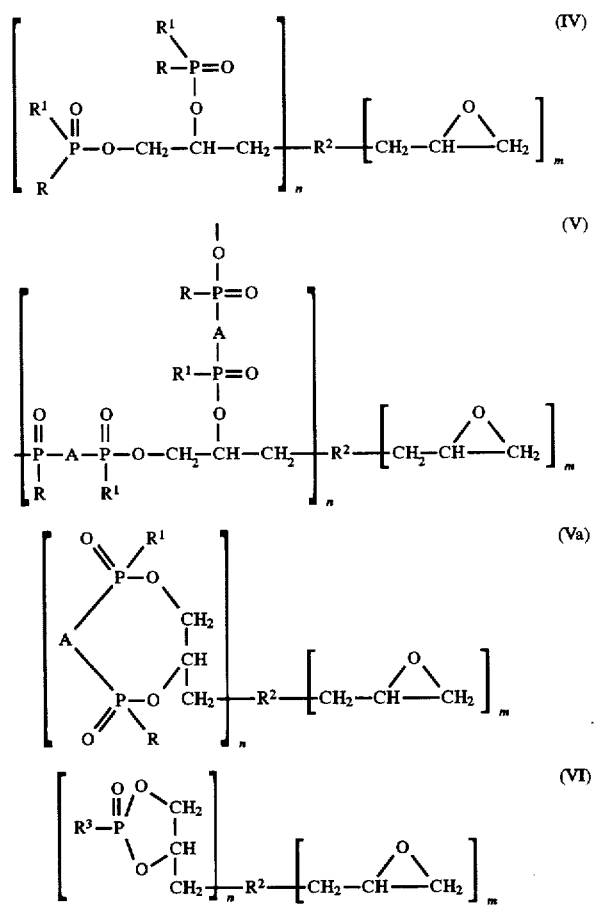

in which

R, R[1] and R[3] are as specified in said formulae (I) to (III);

R[2] is the radical, without the glycidyl groups, of a polyepoxy compound;

n is from 1 to 5;

m is from 1 to 5, where the sum n+m is an integer from 2 to 6.

13. A phosphorus-containing epoxy resin composition as claimed in claim 2, which consists essentially of units of the formula (VI).

14. A phosphorus-containing epoxy resin composition as claimed in claim 2, wherein the ratio of equivalents of component (A) to equivalents of component (B) is in the range of 1:0.1 to 1:0.8.

15. A phosphorus-containing epoxy resin composition as claimed in claim 2, wherein the storage stability of said resin composition is sufficient to maintain at least 90% of its initial epoxy number value after 96 hours of storage at room temperature and a relative atmospheric humidity of up to 50%.

16. A phosphorus-containing epoxy resin composition as claimed in claim 2, wherein said component (B) contains less than 10% by weight of free acids.

17. A composite material consisting essentially of a phosphorus-containing epoxy resin composition of claim 2.

18. A process for preparing the phosphorus-containing epoxy resin composition of claim 1 or 2 which comprises reacting (A) a polyepoxy compound having at least two epoxy groups per molecule with (B) a phosphinic anhydride, phosphonic anhydride, or a combination of phosphinic and phosphonic anhydrides, at a temperature in the range of from −20° to 130° C. and at an (A):(B) equivalent ratio in the range of 1:0.1 to 1:0.8.

* * * * *